(12) United States Patent
Tseng et al.

(10) Patent No.: US 7,023,352 B2
(45) Date of Patent: Apr. 4, 2006

(54) VOLTAGE-DETECTING METHOD AND RELATED CIRCUITS

(75) Inventors: Li-Ming Tseng, Taipei (TW); Jen-Hong Lan, I-Lan Hsien (TW)

(73) Assignee: BenQ Corporation, Tao-Yuan Hsien (TW)

( * ) Notice: Subject to any disclaimer, the term of this patent is extended or adjusted under 35 U.S.C. 154(b) by 133 days.

(21) Appl. No.: 10/709,611

(22) Filed: May 18, 2004

(65) Prior Publication Data

US 2004/0233064 A1    Nov. 25, 2004

(30) Foreign Application Priority Data

May 20, 2003    (TW)    ............... 92113640 A

(51) Int. Cl.
*G08B 21/00*    (2006.01)
(52) U.S. Cl. .............. 340/636.1; 340/636.12; 340/636.15; 340/635; 340/653; 340/660; 340/662; 340/663; 320/136; 320/150
(58) Field of Classification Search ............ 340/636.1, 340/636.12, 636.15, 635, 653, 660, 662, 340/663; 320/124, 125, 136, 150, 151, 153
See application file for complete search history.

(56) References Cited

U.S. PATENT DOCUMENTS

| 4,709,202 A | * | 11/1987 | Koenck et al. | ............. 320/112 |
| 5,900,717 A | * | 5/1999 | Lee | ............................ 320/150 |

* cited by examiner

*Primary Examiner*—Hung Nguyen
(74) *Attorney, Agent, or Firm*—Winston Hsu

(57) ABSTRACT

A voltage-detecting circuit includes a CPU, a comparator, a first resistor, a second resistor, and at least a power level segment detector connected in parallel with the first resistor, the power level segment detector having a third resistor and a first switch serially connected to the third resistor. The battery is electrically connected to a first input end of the comparator. The first resistor is electrically connected between a second input end of the comparator and a reference voltage. The second resistor is electrically connected between the second input end of the comparator and ground. The method includes outputting a control signal with the CPU to control the first switch by determining voltage levels at the output end of the comparator, and outputting a power indication signal with the CPU to indicate the voltage level of the battery by determining voltage levels at the output end of the comparator.

20 Claims, 3 Drawing Sheets

VOLTAGE-DETECTING METHOD AND RELATED CIRCUITS

BACKGROUND OF INVENTION

1. Field of the Invention

The present invention relates to a voltage-detecting circuit, and more particularly, to a method for detecting a power status of a battery with the voltage-detecting circuit, which comprises a comparator, resistors, and switches.

2. Description of the Prior Art

In recent years, the dramatic development of communications technology has brought widespread use of cellular phones. In general, a cellular phone uses a chargeable battery as a power source. Therefore, a user of the cellular phone has to observe the power status of the battery from time to time, facilitated by a voltage-detecting circuit of the cellular phone, to know how long the cellular phone can be used.

According to the prior art, a cellular phone comprises an 8-bit A/D converter to detect power status of a battery, the A/D converter converting an analog power status to a digital representation of the power status. The cellular phone is therefore capable of detecting the power status of the battery by detecting voltages at a variety of pins of the A/D converter.

As far as a method for detecting the power status of the battery is concerned, an A/D converter is simply unnecessary because a user of a cellular phone only cares how long the cellular phone can likely be used. Such a dedicate A/D converter capable of detecting a battery status with up to 256 ($2^8$) power segments is unnecessarily precise and costly for a cellular phone.

SUMMARY OF INVENTION

It is therefore a primary objective of the claimed invention to provide a voltage-detecting method for detecting a power status of a power source, such as a battery, with a simplified voltage-detecting circuit.

According to the claimed invention, the voltage-detecting method comprises a processor having a first general purpose input/output (GPIO) port and a second GPIO port; a comparator having a first input end connected to the battery, a second input end, and an output end connected to the first GPIO port; a first resistor connected between the second input end of the comparator and a first voltage source, and a first power segment detection circuit connected in parallel with the first resistor, the first power segment detection circuit comprising a third resistor and a first switch serially connected to the third resistor, the first switch connected to the second GPIO port, and a second resistor connected between the second input end of the comparator and a second voltage source. The voltage-detecting method comprises the following steps: (a) outputting a first control signal with the processor to control the first switch at the second GPIO port by determining a voltage level at the first GPIO port, and (b) outputting a power signal with the processor by determining a voltage level at the first GPIO port.

It is an advantage of the claimed invention that a voltage-detecting circuit comprising only necessary power segment detection circuits has low cost. It is another advantage of the claimed invention that since the comparator and the switch can be realized by an operational amplifier and an MOS transistor fabricated in an ASIC, the voltage-detecting circuit is of small size.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
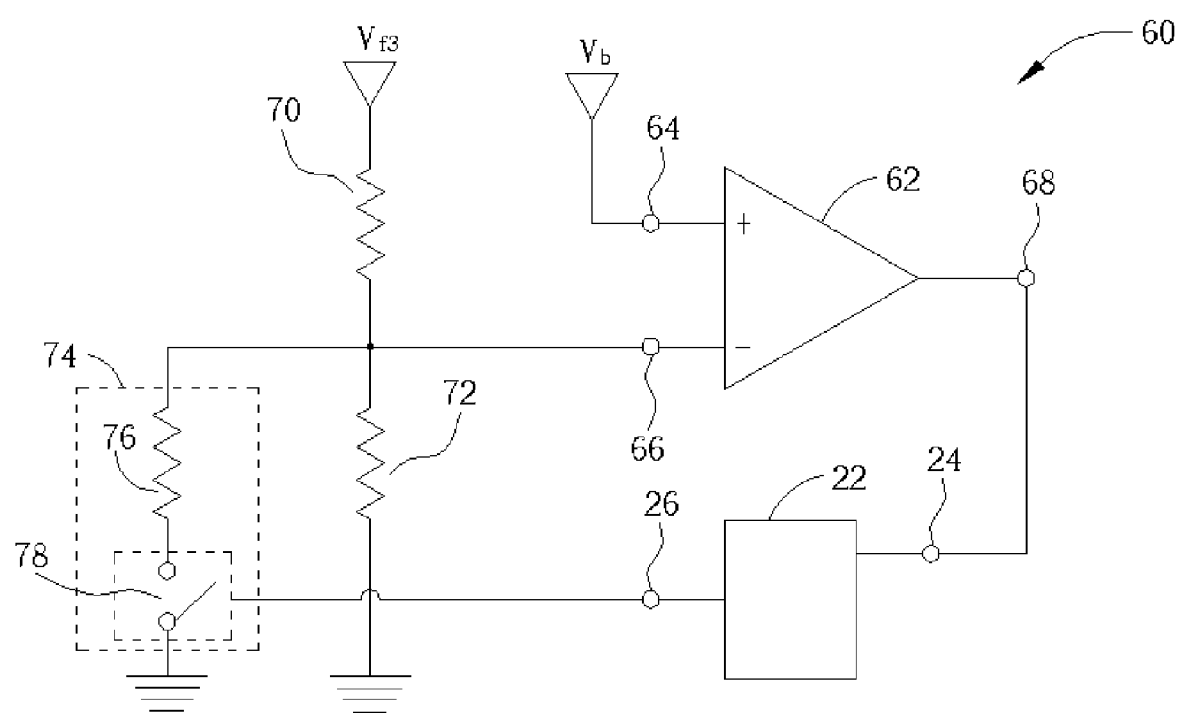
FIG. 1 is a circuit diagram of a first embodiment of a voltage-detecting circuit according to the present invention.

Please refer to FIG. 1, which is a circuit diagram of a preferred embodiment of a voltage-detecting circuit 60 according to the present invention, the voltage-detecting circuit 60 capable of detecting three distinct power statuses ($2^1+1$). The voltage-detecting circuit 60 comprises a processor 22, such as a CPU, a comparator 62, a first resistor 70 having a resistance $R_5$, a second resistor 72 having a resistance of $R_6$, and a first power segment detection circuit 74 connected in parallel with the second resistor 72. The CPU 22 comprises a first general purpose input/output (GPIO) port 24 and a second GPIO port 26. The first power segment detection circuit 74 comprises a third resistor 76 having a resistance of $R_7$ and a first switch 78 serially connected to the third resistor 76, the first switch 78 having operations of "open" and "close" by detecting open and close signals output by the CPU 22 respectively. The comparator 62 can be an operational amplifier installed in an application specific integrated circuit (ASIC). The first switch 78 can be a MOS transistor installed in the ASIC. The comparator 62 comprises a first input end 64 connected to a power source such as a battery of a cellular phone, a second input end 66 connecting the first resistor 70 and a third reference voltage $V_{f3}$ and connecting the second resistor 72 and a sixth reference voltage $V_{f6}$, and an output end 68 connected to the first GPIO port 24. In the preferred embodiment, the sixth reference voltage $V_{f6}$ is ground. The CPU 22 further electrically connects with a display device (not shown).

The voltage-detecting circuit 60 is capable of detecting whether or not a battery voltage $V_b$ of the battery is greater than $(V_{f3}*R_6)/(R_5+R_6)$ (a voltage at the second input end 66 of the comparator 62, the first switch 78 assumed "open"). For example, when the battery voltage $V_b$ is greater than $(V_{f3}*R_6)/(R_5+R_6)$, the comparator 62 outputs a logical high control signal at the output end 68 to indicate that the battery voltage $V_b$ is greater than $(V_{f3}*R_6)/(R_5+R_6)$. On the contrary, when the battery voltage $V_b$ is less than $(V_{f3}*R_6)/(R_5+R_6)$, the comparator 62 outputs a logical low control signal.

Operations of the voltage-detecting circuit 60 are described as follows: In the beginning, the CPU 22 outputs the open signal at the second GPIO port 26 to "open" the first switch 78; if the comparator 62 at this moment first outputs the logical high control signal at the output end 68, indicating that the battery voltage $V_b$ is greater than $(V_{f3}*R_6)/(R_5+R_6)$, the CPU 22 outputs a high power indication signal to the display device; on the contrary, if the comparator 62 first outputs the logical low control signal at the output end 68, indicating that the battery voltage $V_b$ is less than $(V_{f3}*R_6)/(R_5+R_6)$, the CPU 22 outputs the close signal at the second GPIO port 26 to "close" the first switch 78. If the output of the comparator 62 changes to be the logical high control signal at the output end 68, indicating that the battery voltage $V_b$ is between $(V_{f3}*R_6)/(R_5+R_6)$ and $(V_{f3}*R_6 IIR_7)/(R_5+R_6IIR_7)$, the CPU 22 outputs a medium power indication signal to the display device; if the comparator 62 still outputs the logical low control signal instead of the logical high control signal, indicating that the battery voltage $V_b$ is less than $(V_{f3}*R_6IIR_7)/(R_5+R_6IIR_7)$, the CPU 22 outputs a low power indication signal to the display device.

Figure 2:
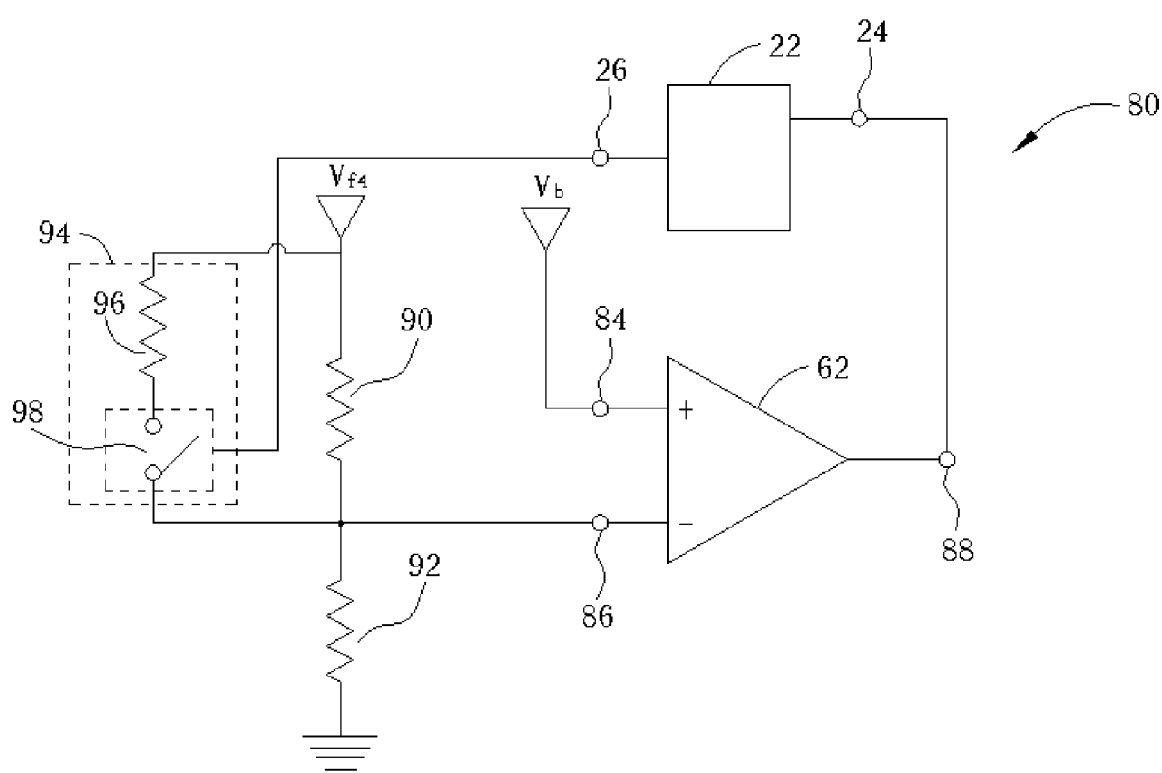
FIG. 2 is a circuit diagram of a second embodiment of a voltage-detecting circuit according to the present invention.

Please refer to FIG. 2, which is a circuit diagram of a second embodiment of a voltage-detecting circuit 80 according to the present invention, the voltage-detecting circuit 80 also capable of detecting three distinct power statuses. The voltage-detecting circuit 80 comprises the CPU 22, a comparator 82, a first resistor 90 having a resistance $R_8$, a second resistor 92 having a resistance of $R_9$, and a second power segment detection circuit 94 connected in parallel with the first resistor 90. The second power segment detection circuit 94 comprises a fourth resistor 96 having a resistance of $R_{10}$ and a second switch 98 serially connected to the fourth resistor 96, the second switch 98 also having operations of "open" and "close" by detecting open and close signals output by the CPU 22 respectively. The comparator 82 can also be an operational amplifier installed in an ASIC. The second switch 98 can be a MOS transistor installed in the ASIC. The comparator 62 comprises a first input end 84 connected to the battery, a second input end 86 connecting the first resistor 90 and a fourth reference voltage $V_{f4}$ and connecting the second resistor 72 and a seventh reference voltage $V_{f7}$, and an output end 88 connected to the first GPIO port 24. In the second embodiment, the seventh reference voltage $V_{f7}$ is ground.

Operations of the voltage-detecting circuit 80 are described as follows: In the beginning, the CPU 22 outputs the close signal at the second GPIO port 26 to "close" the second switch 98; if the comparator 82 at this moment first outputs the logical low control signal at the output end 88, indicating that the battery voltage $V_b$ is less than $(V_{f4}*R_9)/(R_8+R_9)$, the CPU 22 outputs the low power indication signal to the display device; on the contrary, if the comparator 82 first outputs the logical high control signal at the output end 68, the CPU 22 outputs the open signal at the second GPIO port 26 to "open" the second switch 98. If the output of the comparator 82 changes to be the logical low control signal, indicating that the battery voltage $V_b$ is between $(V_{f4}*R_9)/(R_8+R_9)$ and $(V_{f4}*R_9)/(R_9+RIIR_{10})$, the CPU 22 outputs the medium power indication signal to the display device; if the comparator 62 still outputs the logical high control signal instead of the logical high control signal, indicating that the battery voltage $V_b$ is higher than $(V_{f4}*R_9)/(R_9+R_8IIR_{10})$, the CPU 22 outputs the high power indication signal to the display device.

Figure 3:
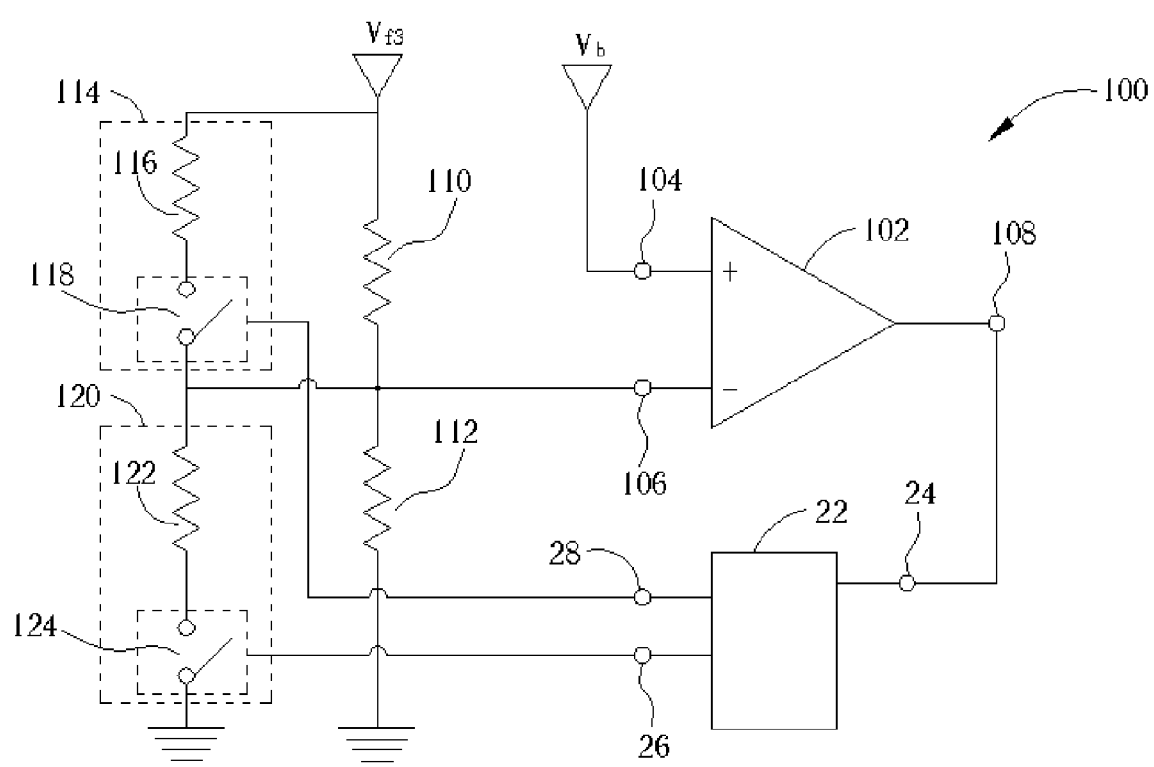
FIG. 3 is a circuit diagram of a third embodiment of a voltage-detecting circuit according to the present invention.

Please refer to FIG. 3, which is a circuit diagram of a third embodiment of a voltage-detecting circuit 100 according to the present invention, the voltage-detecting circuit 100 capable of detecting five distinct power statuses ($2^2+1$). The voltage-detecting circuit 100 comprises the CPU 22, a comparator 102, a first resistor 110 having a resistance $R_{11}$, a second resistor 112 having a resistance of $R_{12}$, a first power segment detection circuit 114 connected in parallel with the first resistor 110, and a second power segment detection circuit 120 connected in parallel with the second resistor 112. The CPU 22 further comprises a third GPIO port 28. The first power segment detection circuit 114 comprises a third resistor 116 having a resistance of $R_{13}$ and a first switch 118 serially connected to the third resistor 116, the first switch 118 also having operations of "open" and "close" by detecting open and close signals output by the CPU 22 respectively. The second power segment detection circuit 120 comprises a fourth resistor 122 having a resistance of $R_{14}$ and a second switch 124 serially connected to the third resistor 122, the second switch 118 also having operations of "open" and "close" by detecting open and close signals output by the CPU 22 respectively. The comparator 102 can be an operational amplifier installed in an ASIC. The first and second switches 118 and 124 can be MOS transistors installed in the ASIC. The comparator 102 comprises a first input end 104 connected to the battery, a second input end 106 connecting the first resistor 110 and a fifth reference voltage $V_{f5}$ and connecting the second resistor 112 and an eighth reference voltage $V_{f8}$, and an output end 108 connected to the first GPIO port 24. In the third embodiment, the eighth reference voltage $V_{f6}$ is ground.

Operations of the voltage-detecting circuit 100 are described as follows: In the beginning, the CPU 22 outputs the close signal at the third GPIO port 28 to "close" the first switch 118 and outputs the open signal at the second GPIO port 26 to "open" the second switch 124; if the comparator 102 at this moment first outputs the logical high control signal at the output end 108, indicating that the battery voltage $V_b$ is higher than $(V_{f5}*R_{12})/(R_{12}+R_{11}IIR_{13})$, the CPU 22 outputs a first high power indication signal to the display device; on the contrary, if the comparator 102 first outputs the logical low control signal at the output end 108, the CPU 22 outputs the open signal at the third GPIO port 28 to "open" the first switch 118. If the output of the comparator 82 changes to be the logical high control signal, indicating that the battery voltage $V_b$ is between $(V_{f5}*R_{12})/(R_{12}+R_{11}IIR_{13})$ and $(V_{f5}*R_{12})/(R_{12}+R_{11})$, the CPU 22 outputs a second high power indication signal to the display device; if the comparator 102 still outputs the logical low control signal instead of the logical high control signal, the CPU 22 outputs the close signal at the third GPIO port 28 to "close" the first switch 118, and outputs the close signal at the second GPIO port 26 to "close" the second switch 124. If the output of the comparator 102 changes to be the logical high control signal at the output end 108, indicating that the battery voltage $V_b$ is between $(V_{f5}*R_{12})/(R_{12}+R_{11})$ and $(V_{f5}*R_{12}IIR_{14})/(R_{12}IIR_{14}+R_{11}IIR_{13})$, the CPU 22 outputs a medium power indication signal to the display device; if the comparator 102 still outputs the logical low control signal at the output end 108, the CPU 22 outputs the open signal at the third GPIO port 28 to "open" the first switch 118. If the output of the comparator 102 changes to be the logical high control signal, indicating that the battery voltage $V_b$ is between $(V_{f5}*R_{12}\|R_{14})/(R_{12}\|R_{14}+R_{11}\|R_{13})$ and $(V_{f5}*R_{12}\|R_{14})/(R_{11}+R_{12}\|R_{14})$, the CPU 22 outputs a second low power indication signal to the display device; if the comparator 102 still outputs the logical low control signal, indicating that the battery voltage $V_b$ is less than $(V_{f5}*R_{12}\|R_{14})/(R_{11}+R_{12}\|R_{14})$, the CPU 22 outputs a first low power indication signal to the display device. The resistors from first to fourth must have resistances such that $(R_{12}\|R_{14})/(R_{12}\|R_{14}+R_{11}\|R_{13})$ is smaller than $(R_{12}/(R_{12}+R_{11}))$.

The first and second power segment detection circuits 114 and 120 mentioned above are connected in parallel with the first and second resistors 110 and 112 respectively. Alternatively, the power-detection circuit 100 can have a variety of connections of the first and second power segment indication circuits 114 and 120 and the first and second resistors 110 and 112. For example, the first and second power segment indication circuits 114 and 120 can be connected in parallel with the first or second resistors 110 and 112 at the same time. Since power-detection circuits of such connections have operations similar to those of the voltage-detecting circuit 100, further description is omitted.

The voltage-detecting circuit 100 comprises only two power segment indication circuits. The voltage-detecting circuit 100 can comprise, of course, more than two cascaded or in parallel power segment indication circuits. Since power-detection circuits of such connections have operations similar to those of the voltage-detecting circuit 100, further description is omitted.

In the above-mentioned voltage-detecting circuits 60, 80 and 100, the comparators 62, 82 and 102 have the first input ends 64, 84 and 104 connected with the battery voltage $V_b$, and the second input ends 66, 86 and 106 connected with the reference voltages $V_{f3}$, $V_{f4}$ and $V_{f5}$ through the first resistors 70, 90 and 110. Alternatively, the comparators 62, 82 and 102 can have the second input ends 66, 86 and 106 connected with the battery voltage $V_b$, and the first input ends 64, 84 and 104 connected with the reference voltages $V_{f3}$, $V_{f4}$ and $V_{f5}$ through the first resistors 70, 90 and 110.

Lastly, in the voltage-detecting circuits 60, 80 and 100, the battery voltage $V_b$ and reference voltage $V_{f3}$, $V_{f4}$ and $V_{f5}$ connections can be exchanged. That is, the battery voltage $V_b$ can be connected with the second input ends 66, 86 and 106 of the comparators 62, 82 and 102 through the first resistors 70, 90 and 110, and the reference voltages $V_{f3}$, $V_{f4}$ and $V_{f5}$ can be directly connected with the first input ends 64, 84 and 104.

In contrast to the prior art, the present invention provides a voltage-detecting circuit of very low cost. The voltage-detecting circuit is capable of detecting a voltage as accurate as possible by including additional power segment detection circuits, the voltage-detecting circuit capable of comprising N power segment detection circuits and detecting a voltage with up to $2^N+1$ power segments. Furthermore, the comparator and the switch can both be realized by an operational amplifier and a MOS transistor fabricated in an ASIC, reducing the physical size of the circuit.

Following the detailed description of the present invention above, those skilled in the art will readily observe that numerous modifications and alterations of the device may be made while retaining the teachings of the invention. Accordingly, the above disclosure should be construed as limited only by the metes and bounds of the appended claims.

What is claimed is:

1. A voltage-detecting method for detecting power status of a battery with a voltage-detecting circuit, the voltage-detecting circuit comprising:
   a processor comprising a first general purpose input/output (GPIO) port and a second GPIO port;
   a comparator having a first input end connected to the battery, a second input end, and an output end connected to the first GPIO port;
   a first resistor connected between the second input end of the comparator and a first voltage source;
   a first power segment detection circuit connected in parallel with the first resistor, the first power segment detection circuit comprising a third resistor and a first switch serially connected to the third resistor, the first switch connected to the second GPIO port; and
   a second resistor connected between the second input end of the comparator and a second voltage source;
   the voltage-detecting method comprising:
   outputting a first control signal with the processor to control the first switch at the second GPIO port by determining a voltage level at the first GPIO port; and
   outputting a power signal with the processor by determining a voltage level at the first GPIO port.

2. The voltage-detecting method of claim 1 further comprising:
   transmitting the power signal to a display device to display the power status of the battery.

3. The voltage-detecting method of claim 1, wherein the first switch is a metal oxide semiconductor (MOS) transistor.

4. The voltage-detecting method of claim 3, wherein the MOS transistor is integrated in an application specific integrated circuit (ASIC).

5. The voltage-detecting method of claim 1, wherein the processor further comprises a third GPIO port, and the voltage-detecting method further comprises:
   providing at least a second power segment detection circuit connected in parallel with the second resistor, the second power segment detection circuit comprising a fourth resistor and a second switch serially connected to the fourth resistor, the second switch connected to the third GPIO port of the processor; and
   outputting a second control signal with the processor to control the second switch at the third GPIO port by determining a voltage level at the first GPIO port.

6. The voltage-detecting method of claim 5, wherein the second switch is a MOS transistor.

7. The voltage-detecting method of claim 6, wherein the MOS transistor is integrated in an ASIC.

8. The voltage-detecting method of claim 1, wherein the first voltage source is ground.

9. The voltage-detecting method of claim 1, wherein the second voltage source is ground.

10. The voltage-detecting method of claim 1, wherein the comparator is integrated in an ASIC.

11. A voltage-detecting circuit comprising:
    a processor comprising a first GPIO port and a second GPIO port;

a comparator having a first input end connected to a battery, a second input end, and an output end connected to the first GPIO port;

a first resistor connected between the second input end of the comparator and a first voltage source;

a first power segment detection circuit connected in parallel with the first resistor, the first power segment detection circuit comprising a third resistor and a first switch serially connected to the third resistor, the first switch connected to the second GPIO port; and a second resistor connected between the second input end of the comparator and a second voltage source;

wherein the processor outputs a first control signal to control the first switch at the second GPIO port by determining a voltage level at the first GPIO port and then generates a power signal by determining a voltage level at the first GPIO port.

12. The voltage-detecting circuit of claim 11 further comprising:

a display device connected to the first GPIO port of the processor for displaying power status of the battery.

13. The voltage-detecting circuit of claim 11, wherein the first switch is a MOS transistor.

14. The voltage-detecting circuit of claim 13, wherein the MOS transistor is integrated in an ASIC.

15. The voltage-detecting circuit of claim 11, wherein the processor further comprises a third GPIO port, and the voltage-detecting circuit further comprises:

at least a second power segment detection circuit connected in parallel with the second resistor, the second power segment detection circuit comprising a fourth resistor and a second switch serially connected to the fourth resistor, the second switch connected to the third GPIO port of the processor;

wherein the processor outputs a second control signal to control the second switch at the third GPIO port by determining a voltage level at the first GPIO port.

16. The voltage-detecting circuit of claim 15, wherein the second switch is a MOS transistor.

17. The voltage-detecting circuit of claim 16, wherein the MOS transistor is integrated in an ASIC.

18. The voltage-detecting circuit of claim 11, wherein the first voltage source is ground.

19. The voltage-detecting circuit of claim 11, wherein the second voltage source is ground.

20. The voltage-detecting circuit of claim 11, wherein the comparator is integrated in an ASIC.

* * * * *

UNITED STATES PATENT AND TRADEMARK OFFICE
CERTIFICATE OF CORRECTION

PATENT NO. : 7,023,352 B2 Page 1 of 1
APPLICATION NO. : 10/709611
DATED : April 4, 2006
INVENTOR(S) : Tseng et al.

It is certified that error appears in the above-identified patent and that said Letters Patent is hereby corrected as shown below:

Title page,
Item [75], Inventors, "Jen-Hong Lan," should read -- Jen-Hong Larn --.

Signed and Sealed this

Twenty-seventh Day of June, 2006

JON W. DUDAS
*Director of the United States Patent and Trademark Office*